United States Patent
Rahman (10) Patent No.: US 7,375,546 B1
(45) Date of Patent: May 20, 2008

(54) METHODS OF PROVIDING PERFORMANCE COMPENSATION FOR SUPPLY VOLTAGE VARIATIONS IN INTEGRATED CIRCUITS

(75) Inventor: Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 154 days.

(21) Appl. No.: 11/449,202

(22) Filed: Jun. 8, 2006

(51) Int. Cl.
H03K 17/16 (2006.01)
H03K 19/003 (2006.01)

(52) U.S. Cl. .............. 326/30; 326/33; 326/26; 326/27

(58) Field of Classification Search ............ 326/26–27, 326/30
See application file for complete search history.

(56) References Cited

U.S. PATENT DOCUMENTS

| | | | |
|---|---|---|---|
| 5,589,783 A * | 12/1996 | McClure ............... | 326/71 |
| 6,177,819 B1 | 1/2001 | Nguyen | |
| 6,236,231 B1 | 5/2001 | Nguyen et al. | |
| 6,476,638 B1 | 11/2002 | Zhou et al. | |
| 7,020,764 B2 | 3/2006 | Kubota et al. | |
| 7,064,582 B2 | 6/2006 | Gallo et al. | |
| 7,215,150 B2 * | 5/2007 | Torres et al. ............ | 326/83 |
| 7,227,390 B1 * | 6/2007 | Bapat et al. ............ | 327/108 |
| 7,248,083 B2 | 7/2007 | Chung | |
| 2004/0113654 A1 | 6/2004 | Lundberg | |
| 2006/0119384 A1 | 6/2006 | Camarota et al. | |
| 2007/0040577 A1 | 2/2007 | Lewis et al. | |

OTHER PUBLICATIONS

U.S. Appl. No. 11/449,172, filed Jun. 8, 2006, Schultz.
U.S. Appl. No. 11/449,198, filed Jun. 8, 2006, Rahman.
U.S. Appl. No. 11/449,203, filed Jun. 8, 2006, Rahman.
U.S. Appl. No. 11/449,240, filed Jun. 8, 2006, Schultz.
Arifur Rahman et al.; "Heterogeneous Routing Architecture for Low-Power FPGA Fabric"; IEEE 2005 Custom Integrated Circuits Conference; Copyright 2005 IEEE; pp. 183-186, no month.

* cited by examiner

Primary Examiner—Anh Q Tran
(74) Attorney, Agent, or Firm—Lois D. Cartier (57) ABSTRACT

Methods of compensating for power supply variations in an integrated circuit. During operation of the IC die, a power supply voltage level is monitored. When the power supply voltage level drops below a specified level, a performance compensation circuit in the IC is enabled, bringing a first delay (e.g., the rising delay) for a compensated circuit in the IC more closely into alignment with a second delay (e.g., a falling delay) for the circuit. When the power supply voltage level exceeds the specified level, the performance compensation circuit is disabled. When the IC is a programmable IC, for example, the compensated circuit can be a programmable interconnect multiplexer of the programmable IC. In these embodiments, the power supply voltage level for the pass transistors in the interconnect multiplexer can be monitored and compensated for as described above.

12 Claims, 9 Drawing Sheets

METHODS OF PROVIDING PERFORMANCE COMPENSATION FOR SUPPLY VOLTAGE VARIATIONS IN INTEGRATED CIRCUITS

FIELD OF THE INVENTION

The invention relates to integrated circuits (ICs). More particularly, the invention relates to methods of providing performance compensation for supply voltage variations in an integrated circuit.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell. The terms "PLD", "programmable logic device", and "programmable integrated circuit" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 1:
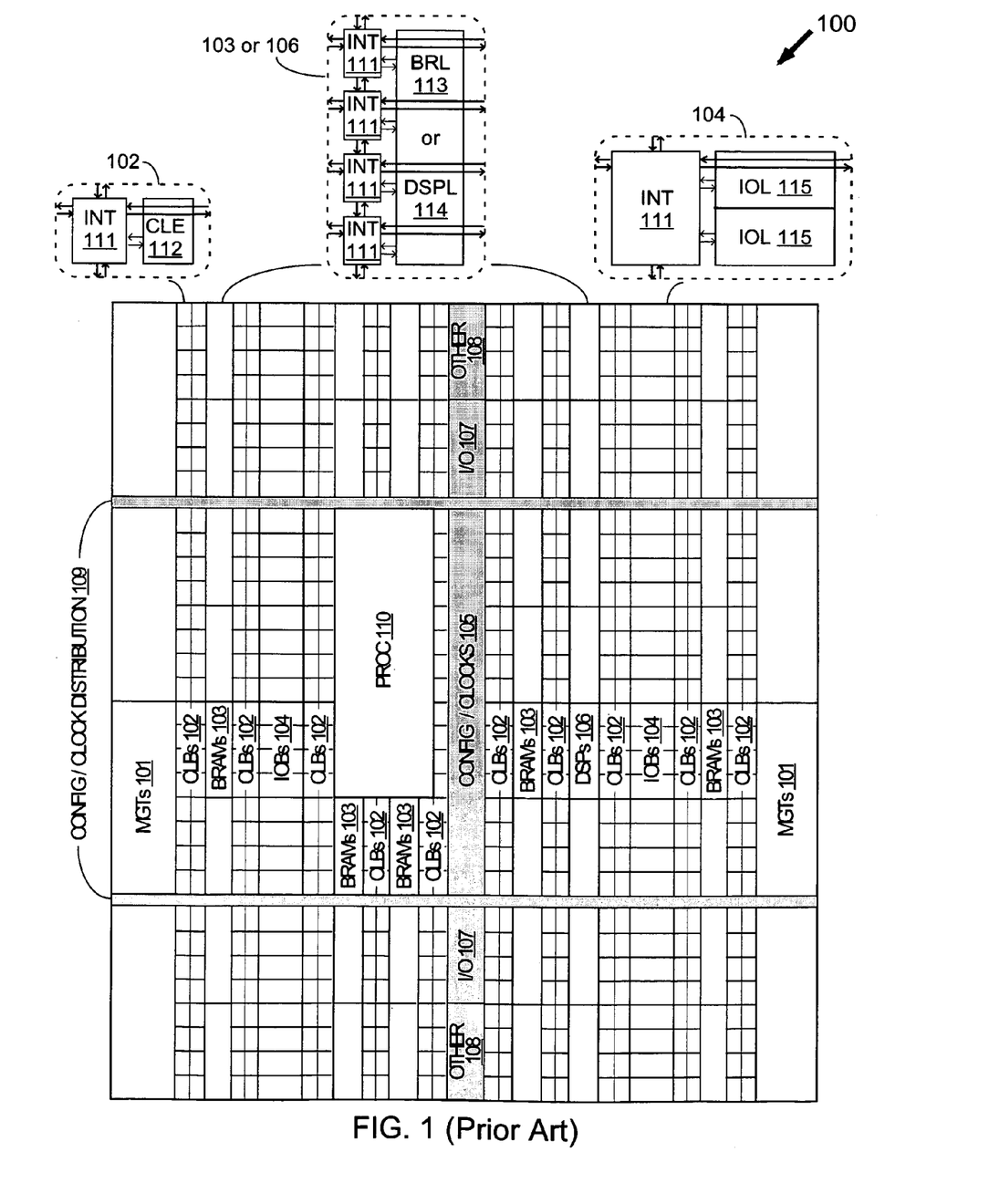
FIG. 1 is an architectural representation of a known field programmable gate array (FPGA).

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

The programmable interconnect structure of a typical PLD includes a large number of programmable multiplexers. Each programmable multiplexer selects one of two or more input signals (e.g., from interconnect lines), and passes the selected input signal to a destination (e.g., to another interconnect line).

Figure 2:
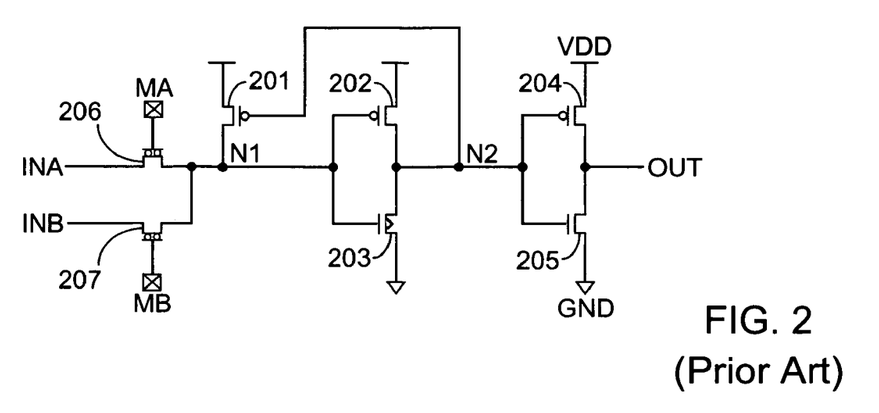
FIG. 2 is a schematic diagram of a known programmable multiplexer that can be included, for example, in the programmable interconnect structure of an FPGA.

FIG. 2 illustrates an exemplary programmable multiplexer that can be included, for example, in the programmable interconnect structure of a PLD. Note that programmable multiplexers can include more than two input signals, sometimes many more than two. However, for clarity, FIG. 2 illustrates an exemplary multiplexer having two input signals.

The programmable 2-to-1 multiplexer of FIG. 2 includes several types of transistors, coupled together as shown in FIG. 2. (Note that in some known PLD, programmable multiplexers are implemented with fewer transistor types than those shown in FIG. 2, which is merely exemplary.) Pull-up transistors 202 and 204 are typical P-channel transistors. Pull-down transistor 205 is a typical N-channel transistor. Pull-down transistor 203 is a low threshold voltage (low Vt) N-channel transistor. (Note that low Vt transistor 203 is drawn with a triangle in the gate, indicating the low Vt implementation.) Pull-up transistor 201 is a weak pull-up, i.e., a P-channel transistor having a larger resistance than typical pull-up transistors 202 and 204. Pass transistors 206 and 207 are N-channel transistors having a "mid-ox" oxide thickness larger than the oxide thickness of transistors 201-205, but smaller than the oxide thickness of input/output transistors. (Note that mid-ox transistors 206 and 207 are drawn with two bubbles in the gate; indicating the mid-ox implementation.) The programmable 2-to-1 multiplexer of FIG. 2 also includes two configuration memory cells MA and MB controlling pass transistors 206 and 207, respectively. Memory cells MA and MB drive transistors 206 and 207 at a gate voltage VGG higher than the standard power high voltage VDD, in order to increase the speed of the programmable interconnect.

The programmable 2-to-1 multiplexer of FIG. 2 functions as follows. Transistors 206 and 207 are coupled to form a 2-to-1 multiplexer controlled by values stored in configuration memory cells MA and MB to pass one of input signals INA and INB to node N1. The value on node N1 is then buffered by two inverters coupled in series, with transistors 202 and 203 forming the first inverter, and transistors 204 and 205 forming the second inverter. The second inverter drives the output node OUT, which can be, for example, another interconnect line.

Weak pull-up 201 is included because, as is well known, a high value passed through an N-channel transistor is reduced in voltage by one threshold voltage of the N-channel transistor. Therefore, in the absence of transistor 201, when a high value (VDD) is placed on node N1 from node INA, for example, the voltage at node N1 is the lesser of VDD and VGG–Vt (the "mid-ox" power high minus the threshold voltage of transistor 206). Note that transistors 206 and 207 have a higher threshold voltage than transistor 205, for example, because of their mid-oxide implementation. Therefore, a high voltage passed to node N1 by either of these transistors may be substantially reduced from the value of power high VGG. When node N1 rises to a sufficiently high voltage level, node N2 goes low, and weak pull-up 201 serves to pull node N1 to a fully high value of VDD. Transistor 203 is given a low threshold to compensate for the reduced power high level on node N1, and also to speed up the transition of node N2 from a high value to a low value.

Even including all of these different types of transistors, however, does not overcome an inherent limitation of the circuit of FIG. 2. This limitation is that the delay on a low-to-high transition through the circuit (i.e., signal OUT going from low to high) displays different timing characteristics from a high-to-low transition (i.e., signal OUT going from high to low). This difference is exacerbated, for example, by differences in the semiconductor fabrication process that typically occur during the manufacture of any integrated circuit. For example, a "slow" die (e.g., where transistors are slower than on a typical die) might display more variation between the low-to-high transition speed and the high-to-low transition speed than a "fast" die (e.g., where transistors are faster than on a typical die), because rise delays are typically more sensitive to process variation than fall delays. The difference between high-to-low (falling) transitions and low-to-high (rising) transitions can also vary based on differences in the power supply voltage supplied to two different ICs.

It is desirable to have balanced delays for rising and falling transitions in an integrated circuit (IC), because the operating speed is typically limited by the delays on the slowest paths through the circuit. It is further desirable to provide balanced delays for programmable ICs, because a user circuit can be implemented in many different ways. For example, in a first implementation, a critical path might include a rising transition in one interconnect line segment and a falling transition in another interconnect line segment, and, in another implementation, might route only rising-edge-critical signals through the interconnect structure, and so forth. Therefore, it is desirable to provide structures and methods that can improve the balance between delays for rising and falling transitions in programmable ICs.

SUMMARY OF THE INVENTION

The invention provides circuits and methods of compensating for process variations and/or variations in power supply voltage in an integrated circuit. Multiplexer circuits can be programmed to selectively balance the rising and falling delays through the circuits in the presence of process variations and/or variations in power levels. These multiplexer circuits can be used, for example, as programmable interconnect multiplexers in the interconnect structures of programmable logic devices (PLDs).

According to one aspect of the invention, a multiplexer circuit includes a multiplexer (e.g., driven by a plurality of interconnect lines in a PLD), a logic gate (e.g., an inverter) driven by the multiplexer, and a performance compensation circuit. The performance compensation circuit is coupled to the output terminal of the logic gate, and has an compensation enable input terminal. The performance compensation circuit is coupled to adjust a trip point of the logic gate based on a value of a signal provided on the compensation enable input terminal. This signal can be, for example, a global compensation enable signal that enables all of the multiplexer circuits in a PLD to adjust the trip points of their respective logic gates. The invention also encompasses an IC that includes a multiplexer circuit similar to the circuit just described, e.g., a PLD in which the interconnect structure is implemented using performance-compensated interconnect multiplexers.

According to another aspect of the invention, during wafer sort (wafer level characterization) or final test, a process corner can be determined for each die. One or more E-fuses can be set to predetermined level(s) to program the process corner information into the die, or the values can be stored in some other type of non-volatile memory (e.g., FLASH memory or an EEPROM). The stored values are then utilized by the programmable multiplexer circuits to optionally adjust the rising and/or falling delays through the multiplexer circuits to achieve a balance between the rising and falling delays.

According to another aspect of the invention, during operation of the IC die, a power supply voltage level is monitored. When the power supply voltage level drops below a specified level, a performance compensation circuit in the IC is enabled, bringing a first delay (e.g., the rising delay) for a compensated circuit in the IC more closely into alignment with a second delay (e.g., a falling delay) for the circuit. When the power supply voltage level exceeds the specified level, the performance compensation circuit is disabled. When the IC is a programmable IC, for example, the compensated circuit can be a programmable interconnect multiplexer of the programmable IC. Pass transistors in these programmable interconnect multiplexers sometimes operate at a higher power supply voltage level than other transistors in the programmable IC. In these embodiments, the power supply voltage level for these pass transistors can be monitored and compensated for as described above.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of integrated circuits (ICs). The present invention has been found to be particularly applicable and beneficial for programmable logic devices (PLDs). An appreciation of the present invention is presented by way of specific examples utilizing PLDs such as field programmable gate arrays (FPGAs). However, the present invention is not limited by these examples.

Figure 3:
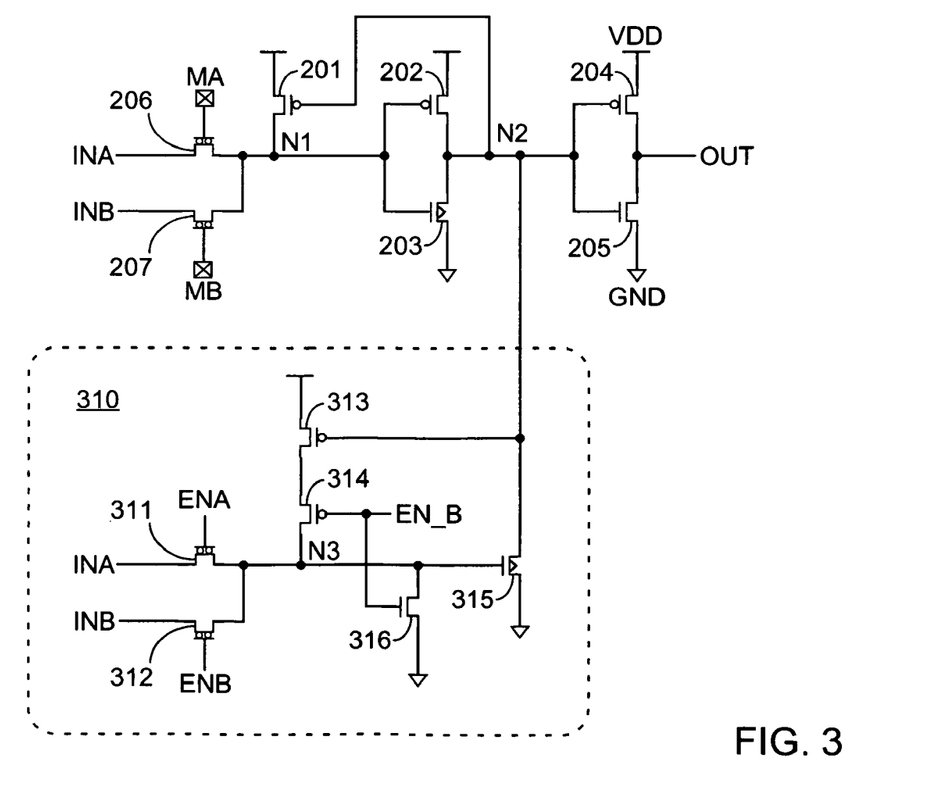
FIG. 3 is a schematic diagram of a first programmable multiplexer circuit that can be selectively controlled to balance the rising and falling delays through the multiplexer circuit.

FIG. 3 is a schematic diagram of a first programmable multiplexer circuit that can be selectively controlled to balance the rising and falling delays through the multiplexer circuit. The programmable multiplexer circuit of FIG. 3 includes elements 201-207, which correspond to similarly numbered elements in the programmable 2-to-1 multiplexer illustrated in FIG. 2. These elements form a circuit that functions in a manner similar to the circuit of FIG. 2, and this circuit is not again described. However, the circuit of FIG. 3 also includes a performance compensation circuit 310 coupled to node N2. Performance compensation circuit 310 acts, when enabled, to increase the speed of a falling edge at node N2, which in turn increases the speed of a rising edge at node N1 due to the feedback path from node N2 to pull-up 201.

Assuming comparable rise and fall delays in the typical process corner, the rise delay of a circuit node deteriorates more than the fall delay from the typical process corner to the slow process corner. The circuit of FIG. 3 is designed to overcome this limitation. In some embodiments, in a slow process corner, the performance compensation circuit 310 is enabled by a programmable option, and adjusts the trip point of an inverter (202/203) in the circuit in favor of its fall delay, which decreases the rise delay of the overall circuit. In other embodiments, the circuit of FIG. 3 is used to overcome differences in operating voltage. When the supply voltage falls below a specified voltage level, performance compensation circuit 310 is enabled to adjust the trip point of inverter 202/203 in the same fashion. Therefore, in some embodiments performance compensation is statically controlled (e.g., by a value programmed into non-volatile memory), while in other embodiments performance compensation is dynamically controlled (e.g., by comparing a supply voltage to a specified voltage level). Some embodiments provide both static and dynamic performance compensation.

As described above, a delay on a low-to-high transition through the circuit (i.e., signals N1 and OUT going from low to high, node N2 going from high to low) displays different timing characteristics from a high-to-low transition (i.e., signals N1 and OUT going from high to low, node N2 going from low to high). This difference is exacerbated, for example, by differences in the semiconductor fabrication process, and/or by differences in power supply voltage levels. Note that rise delays at node N1 are typically more sensitive to process variation than fall delays at node N1, because of the well-known threshold voltage drop across pass transistors 206 and 207, as described above. Therefore, the ability of performance compensation circuit 310 to optionally decrease the fall time of node N2 makes it possible to balance rise and fall delays through the circuit, e.g., to bring the rising delay of the circuit more closely into alignment with the falling delay of the circuit. This ability is particularly valuable because of the variation in rise and fall times that occurs across process corners or due to variation in power supply voltages between different ICs. In some processing technologies, the enabling of a performance compensation circuit such as those shown herein can reduce the fall time of node N2 by about fifteen percent, for example.

Exemplary performance compensation circuit 310 includes a multiplexer (mid-oxide pass transistors 311 and 312), P-channel pull-up transistors 313 and 314, a low-threshold pull-down transistor 315, and a pull-down 316, coupled together as shown in FIG. 3. In the pictured embodiment, pass transistor 311 is controlled by a first enable signal ENA, pass transistor 213 is controlled by a second enable signal ENB, and transistors 314, 316 are controlled by a third enable signal EN_B.

Performance compensation circuit 310 functions as follows. When circuit 310 is disabled, signals ENA and ENB are both low, and signal EN_B is high. Node N3 is low (transistor 316 ensures that node N3 does not float), and pull-down 315 is fully turned off. The multiplexer circuit behaves essentially as if performance compensation circuit 310 is not present. There may be a small performance degradation compared to the circuit of FIG. 2 due to the increased gate capacitance on node N2, but this effect is minor. In one embodiment, the performance degradation due to gate capacitance in the compensation circuit is less than or about five percent.

When performance compensation circuit 310 is enabled, signal EN_B is low, pull-up transistor 314 is on, and pull-down transistor 316 is off. When one of pass transistors 311, 312 passes a high value to node N3, transistor 315 turns on, assisting with quickly pulling down node N2. The low value on node N2 turns on pull-up transistor 313, pulling node N3 all the way to power high VDD, further assisting with pulling down node N2 through transistor 315. When circuit 310 is enabled and one of pass transistors 311, 312 passes a low value to node N3, transistor 315 is off, and the performance compensation circuit has little or no effect on node N2.

Figure 4:
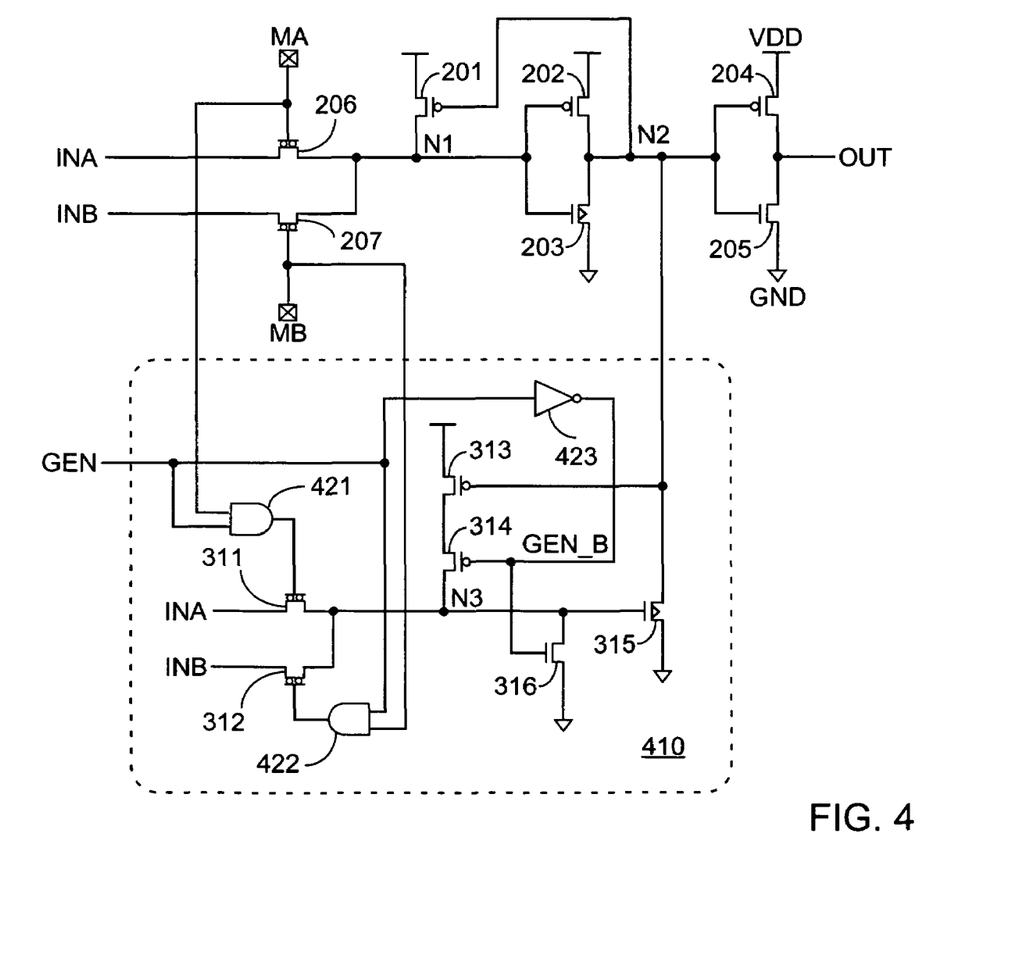
FIG. 4 is a schematic diagram of a second programmable multiplexer circuit that can be selectively controlled to balance the rising and falling delays through the multiplexer circuit.

FIG. 4 shows another embodiment of a programmable multiplexer circuit that can be selectively controlled to balance the rising and falling delays through the multiplexer circuit. The circuit of FIG. 4 is similar to that of FIG. 3, with the addition of AND gates 421, 422 and inverter 423. In the embodiment of FIG. 4, the configuration memory cell MA controlling transistor 206 also controls pass transistor 311. When the value stored in configuration memory cell MA is high, for example, signal INA is provided to node N1 through transistor 206. If a global compensation enable signal GEN is also high, transistor 311 turns on to provide signal INA to node N3. Similarly, when the value stored in configuration memory cell MB is high, signal INB is provided to node N1 through transistor 207. If global compensation enable signal GEN is also high, transistor 312 turns on to provide signal INB to node N3. When global compensation enable signal GEN is high, inverter 423 inverts the signal to provide signal GEN_B. Thus, when performance compensation is globally enabled, pull-up transistor 314 turns on and pull-down transistor 316 turns off, to allow node N3 to reach the full power high value of VDD.

In other embodiments (not shown), pass transistors 311 and 312 are controlled by separate configuration memory cells from configuration memory cells MA and MB. In still other embodiments (not shown), pull-up transistor 314 is controlled by another configuration memory cell, a different type of logic gate, or a second global performance compensation enable signal.

Figure 5:
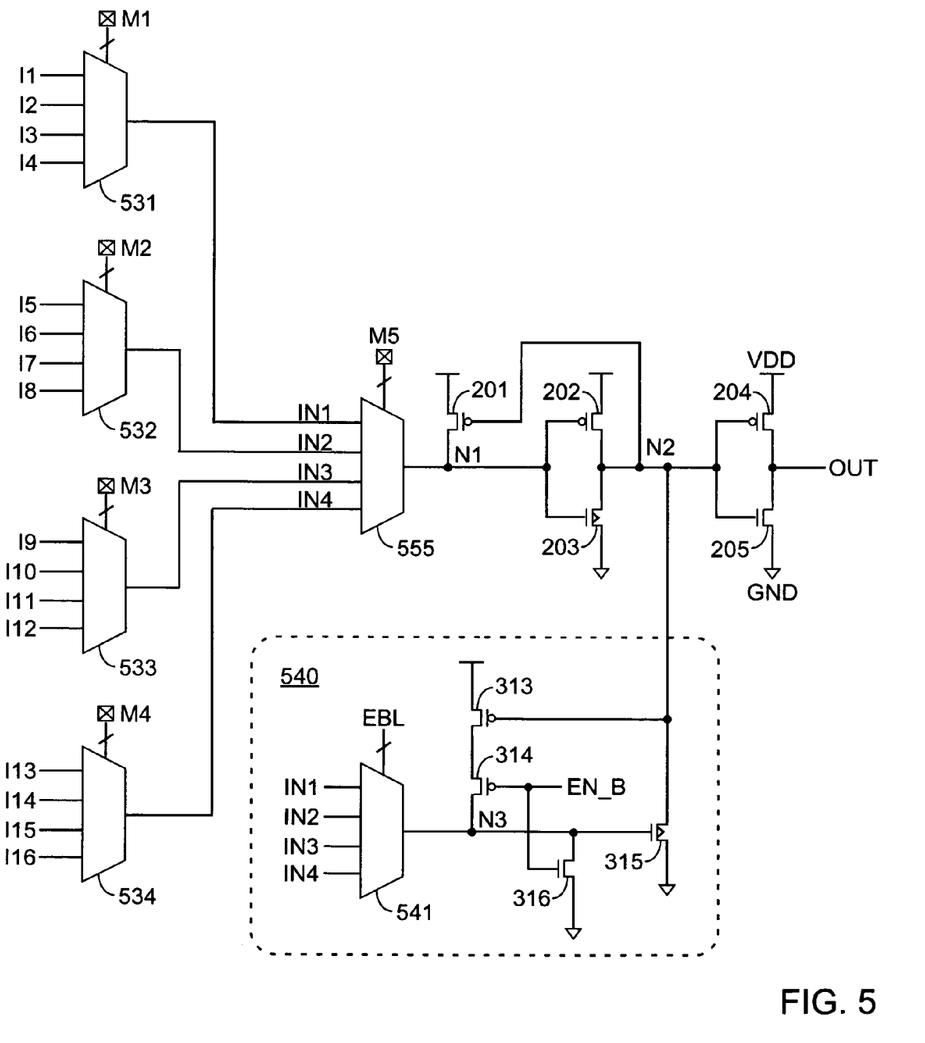
FIG. 5 is a schematic diagram of a third programmable multiplexer circuit that can be selectively controlled to balance the rising and falling delays through the multiplexer circuit.

FIGS. 3 and 4 illustrate programmable multiplexer circuits having only two data inputs. However, interconnect multiplexers typically have more than two data inputs, sometimes many more than two. FIG. 5 illustrates in exemplary fashion one way in which a larger multiplexer circuit can be implemented to enable performance compensation.

The programmable multiplexer circuit of FIG. 5 is similar to the circuit of FIG. 3, and similar elements are not again described. The two-input multiplexer including transistors 206 and 207 (see FIG. 2) is replaced by a 16-input multiplexer implemented in two stages, with a first stage including 4-to-1 multiplexers 531-534 and a second stage including 4-to-1 multiplexer 555. The final stage multiplexer 555 is replicated as part of the performance compensation circuit 540, as 4-to-1 multiplexer 541, and is controlled by an enable bus EBL. EBL can be, for example, a 2-bit or 4-bit bus. In some embodiments, the enable bus EBL is generated by configuration memory cells M5 that control the final stage of the 16-input multiplexer, gated by a global compensation signal similar to signal GEN of FIG. 4.

Note that the area overhead of the performance compensation circuit shown in FIG. 5 is proportionally much less than the area overhead of the performance compensation circuit shown in FIG. 3. The larger the number of data inputs to the multiplexer circuit, the smaller the overhead required to implement the invention. Therefore, the invention can be applied to interconnect multiplexers in a typical PLD, for example, without inordinately increasing the size of the interconnect structure. However, if desired, programmable performance compensation can be supplied to some but not all of the interconnect multiplexers in a PLD. For example, in a PLD that provides both fast and slow interconnect, performance compensation could be applied only to the fast interconnect, as increasing the speed of the fast interconnect has the most positive effect on the overall performance of a user circuit implemented in the PLD.

As will be clear to those of skill in the relevant arts, FIG. 5 illustrates only one of many ways in which the concepts of FIG. 3 can be extended to provide performance compensation to wider multiplexer circuits. It will be apparent to one skilled in the art after reading this specification that the present invention can be practiced within many other architectural variations.

Figure 6:
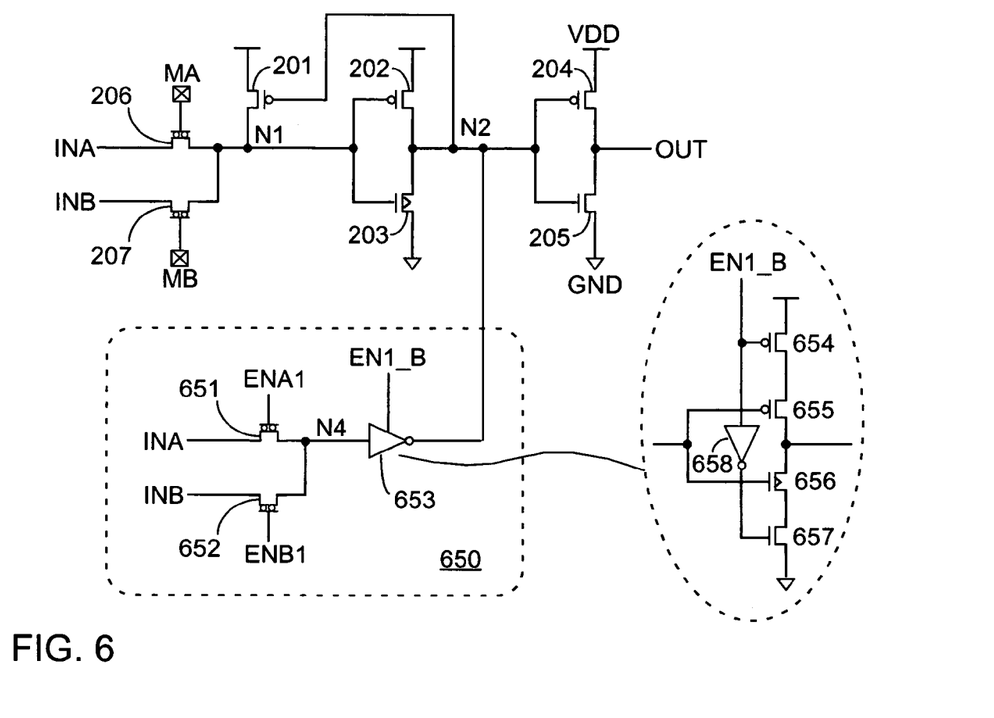
FIG. 6 is a schematic diagram of a fourth programmable multiplexer circuit that can be selectively controlled to balance the rising and falling delays through the multiplexer circuit.

For example, FIG. 6 illustrates another embodiment of a programmable multiplexer circuit that can be selectively controlled to balance the rising and falling delays through the multiplexer circuit. Performance compensation circuit 650 includes a multiplexer (mid-oxide pass transistors 651 and 652) and a tristate buffer 653, coupled together as shown in FIG. 6. In the pictured embodiment, pass transistor 651 is controlled by a first enable signal ENA1, pass transistor 213 is controlled by a second enable signal ENB1, and tristate buffer 653 is controlled by a third enable signal EN1_B. Tristate buffer 653 can be implemented, for example, as shown in FIG. 6, comprising P-channel transistors 654, 655 and N-channel transistors 656, 657, coupled in series between power high VDD and ground GND. In some embodiments, tristate buffer 653 is implemented to have a trip point skewed toward the falling edge. For example, transistor 656 can be implemented as a low-threshold transistor, as shown in FIG. 6. In some embodiments, transistor 657 is also implemented as a low-threshold transistor, e.g., when performance compensation is dynamically controlled. In some embodiments, transistors 656 and 657 are wider than standard N-channel transistors, to skew the trip point of tristate buffer 653.

Performance compensation circuit 650 functions as follows. When circuit 650 is disabled, signals ENA1 and ENB1 are both low, and signal EN1_B is high. Because signal EN1_B is high, tristate buffer 653 does not drive node N2, and the multiplexer circuit behaves essentially as if performance compensation circuit 650 is not present. When performance compensation circuit 650 is enabled, signal EN1_B is low, and tristate buffer 653 is enabled. (Transistor 654 is on, and inverter 658 ensures that transistor 657 is also on.) Therefore, the value on node N4 is inverted and passed to node N2. Because the trip point of tristate buffer 653 is skewed towards the falling edge, node N2 changes state from high to low earlier than if circuit 650 were not present. Node N2 also changes from high to low faster than if circuit 650 were not present. Therefore, the speed of a rising edge passing through the multiplexer circuit is increased.

Figure 7:
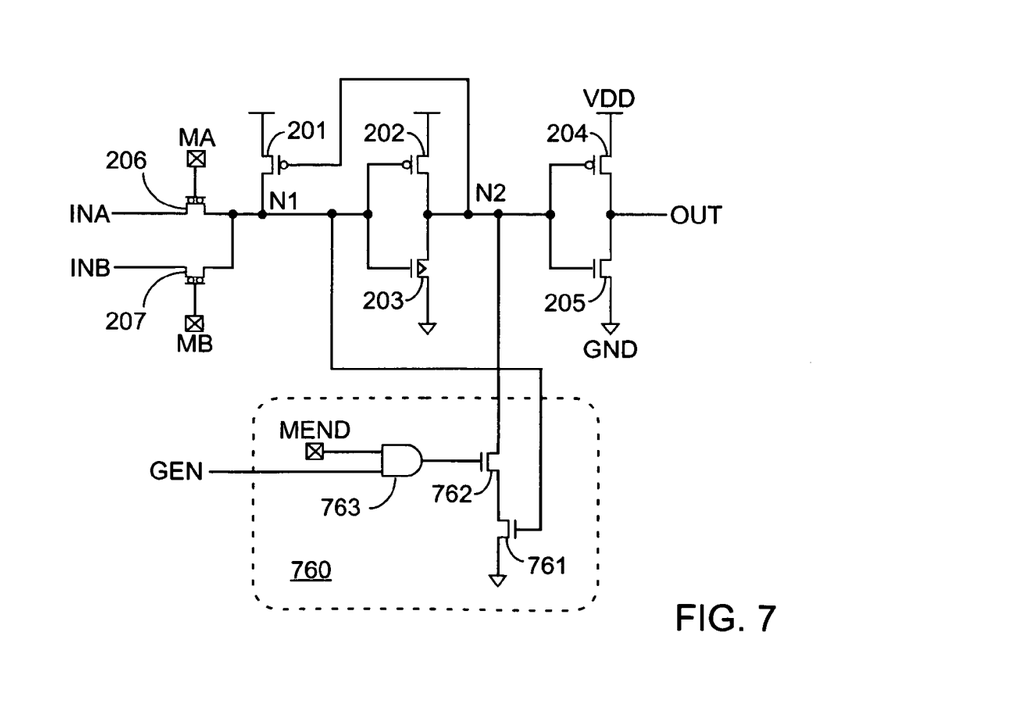
FIG. 7 is a schematic diagram of a fifth programmable multiplexer circuit that can be selectively controlled to balance the rising and falling delays through the multiplexer circuit.

FIG. 7 illustrates another embodiment of a programmable multiplexer circuit that can be selectively controlled to balance the rising and falling delays through the multiplexer circuit. Performance compensation circuit 760 includes two pull-down transistors 762, 761 coupled in series between node N2 and ground GND. One pull-down transistor 761 is driven by node N1, and the other pull-down transistor 762 is driven by a compensation enable signal that can be provided, for example, by AND gate 763. When performance compensation is disabled (e.g., signal GEN is low), transistor 762 is turned off and the multiplexer circuit behaves in essentially the same fashion as the circuit of FIG. 2. When performance compensation is enabled (e.g., signal GEN is high and configuration memory cell MEND stores a high value), compensation circuit 760 provides an additional pull-down path on node N2, controlled by node N1. In one embodiment, for example, configuration memory cell MEND stores a high value whenever one of memory cells MA and MB stores a high value. In another embodiment (not shown), configuration memory cell MEND is omitted, and AND gate 763 is a 3-input AND gate driven by memory cell MA, memory cell MB, and compensation enable signal GEN. When the multiplexer circuit has a larger number of data inputs (e.g., as shown in FIG. 5), it may be more area-efficient to include a single memory cell such as MEND instead of using additional logical gates to generate a control signal for transistor 762.

Figure 8:
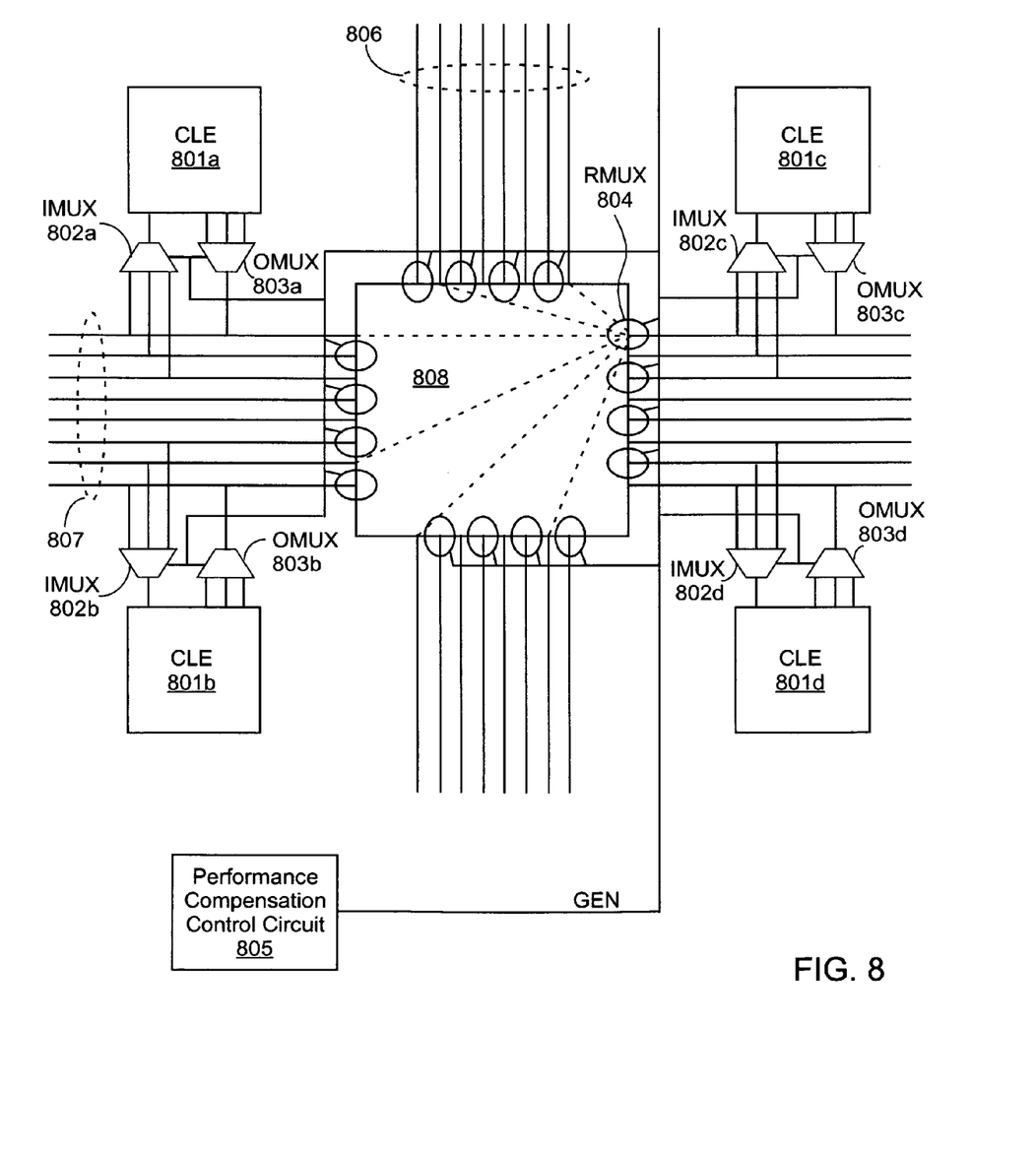
FIG. 8 illustrates a programmable logic device (PLD) that includes interconnect multiplexers implemented using, for example, one or more of the performance compensation techniques shown in FIGS. 3-7.

FIG. 8 illustrates a programmable logic device (PLD) that includes interconnect multiplexers implemented using, for example, one or more of the performance compensation techniques shown in FIGS. 3-7. The PLD of FIG. 8 includes configurable logic elements (CLEs) 801a-801d, vertical interconnect lines 806, horizontal interconnect lines 807, input multiplexers (IMUXes) 802a-802d providing programmable interconnections from the horizontal interconnect lines 807 to the CLEs, output multiplexers (OMUXes) 803a-803d providing programmable interconnections from the CLEs to the horizontal interconnect lines 807, routing multiplexer structure 808 programmably interconnecting the horizontal and vertical interconnect lines, and performance compensation control circuit 805. Note that the simplified PLD architecture illustrated in FIG. 8 is purely exemplary, and the circuits and methods of the invention are not limited to the PLD architecture illustrated in FIG. 8. The circuits and methods of the invention can be applied, for example, to PLD architectures similar to that shown in FIG. 1, and/or to other architectures (not shown).

Routing multiplexer structure 808 includes interconnect multiplexers (RMUXes) 804. Each interconnect multiplexer 804 is driven by two or more of the interconnect lines entering the routing multiplexer structure 808, and drives an interconnect line exiting the routing multiplexer structure 808. The interconnect multiplexers can be implemented, for example, in the manner shown in FIGS. 3-7, or in some other manner. Each illustrated interconnect multiplexer 804 is coupled to receive a global performance compensation enable signal GEN, which is generated by performance compensation control circuit 805. In the illustrated embodiment, global performance compensation enable signal GEN is also provided to the input multiplexers (MUXes) and output multiplexer (OMUXes). In other embodiments (not shown), signal GEN is provided to the interconnect multiplexers but not to the input multiplexers or output multiplexers, or only to the output multiplexers, or to some other subset of the multiplexers shown in FIG. 8.

In some embodiments (not shown), some but not all of the interconnect multiplexers have the performance compensation feature. For example, some of the interconnect multiplexers could be implemented as shown in FIG. 2. In some embodiments, performance compensation is provided only for the interconnect multiplexers driving the fastest interconnect lines, or only on for the most heavily loaded interconnect lines. For example, a PLD could be designed to include both interconnect designed for high speed and interconnect designed for low power consumption. In this embodiment, the performance compensation techniques described herein could be applied only to the interconnect design for high performance.

Figure 8A:
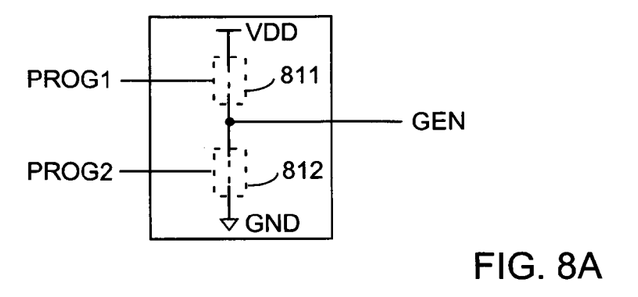
FIGS. 8A-8D illustrate in simplified form four exemplary embodiments of the performance compensation control circuit included in the PLD of FIG. 8.
Figure 8B:
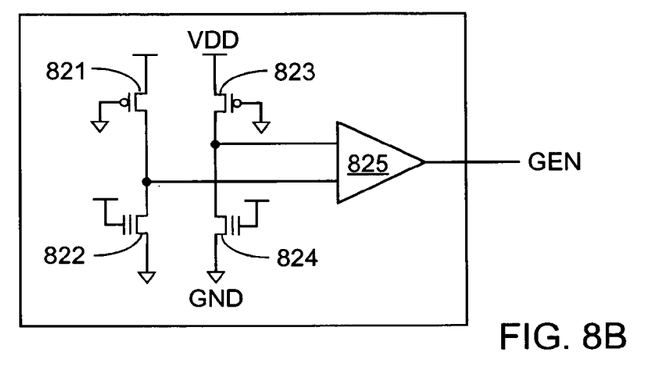

Performance compensation control circuit 805 can be implemented in many different ways. For example, FIG. 8A shows an embodiment of circuit 805 in which the value of signal GEN is programmed into a non-volatile memory comprising an E-fuse structure. Blowing fuse 811 using signal PROG1 ties signal GEN permanently to a power high terminal. Blowing fuse 812 using signal PROG2 ties signal GEN permanently to a ground terminal. FIG. 8B shows another embodiment of circuit 805 in which signal GEN is stored in another type of non-volatile memory such as an EEPROM cell, an EPROM cell, a FLASH memory cell, or another type of non-volatile memory. In the pictured embodiment, a flash memory cell includes P-channel transistors 821, 823 and flash transistors 822, 824, coupled together as shown in FIG. 8B. The two output signals from the flash memory cell drive a sensing circuit 825, which in turn provides signal GEN. This type of non-volatile memory is well known, and can be used, for example, in the PLD of FIG. 8. However, the non-volatile memory cell can be implemented in some other fashion, if desired.

FIGS. 8A and 8B illustrate embodiments in which the value of signal GEN is stored in a non-volatile fashion in the PLD, e.g., as part of the testing procedure prior to distribution to a customer. In these embodiments, the performance compensation process is transparent to the customer. However, the circuits illustrated in FIGS. 3-7 can also be used to dynamically provide performance compensation, enabling compensation when needed, and disabling compensation when it is not needed. For example, performance compensation control circuit 805 can be implemented as a sensor that monitors supply voltage at the pass transistors in the interconnect multiplexers, and enables performance compensation only when the supply voltage drops below a specified level.

Figure 8C:
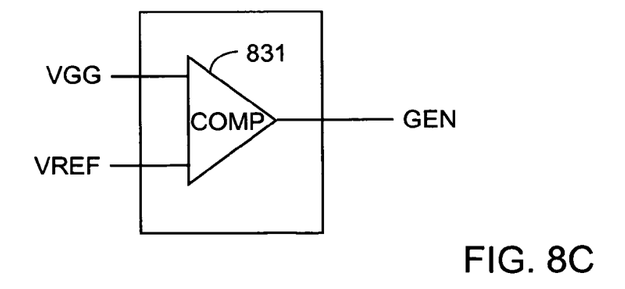

In the embodiment of FIG. 8C, performance compensation control circuit 805 is implemented using a comparator, which compares the power supply voltage VGG of the multiplexer pass transistors to a reference voltage VREF. When VGG drops below VREF, signal GEN is driven high, enabling performance compensation. When VGG rises above VREF (or is equal to VREF, in some embodiments), signal GEN goes low again, disabling performance compensation.

Figure 8D:
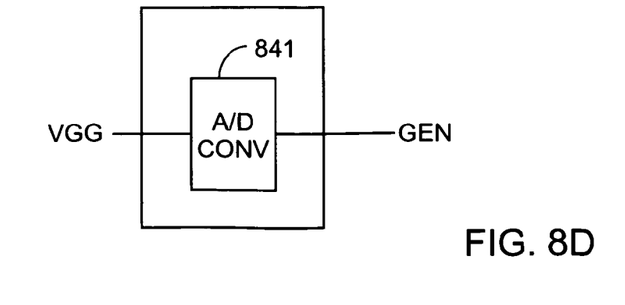

In the embodiment of FIG. 8D, performance compensation control circuit 805 is implemented as an A/D (analog-to-digital) converter. The value of power supply VGG is converted to either a high value or a low value, depending on the value of VGG. A sufficiently high value of VGG causes signal GEN to go high. A sufficiently low value of VGG causes signal GEN to go low.

FIGS. 8A-8D illustrate four exemplary embodiments of performance compensation control circuit 805 of FIG. 8. However, it will be apparent to those of skill in the art that many other embodiments are possible, and can be used to implement the circuits and methods of the present invention.

Figure 9:
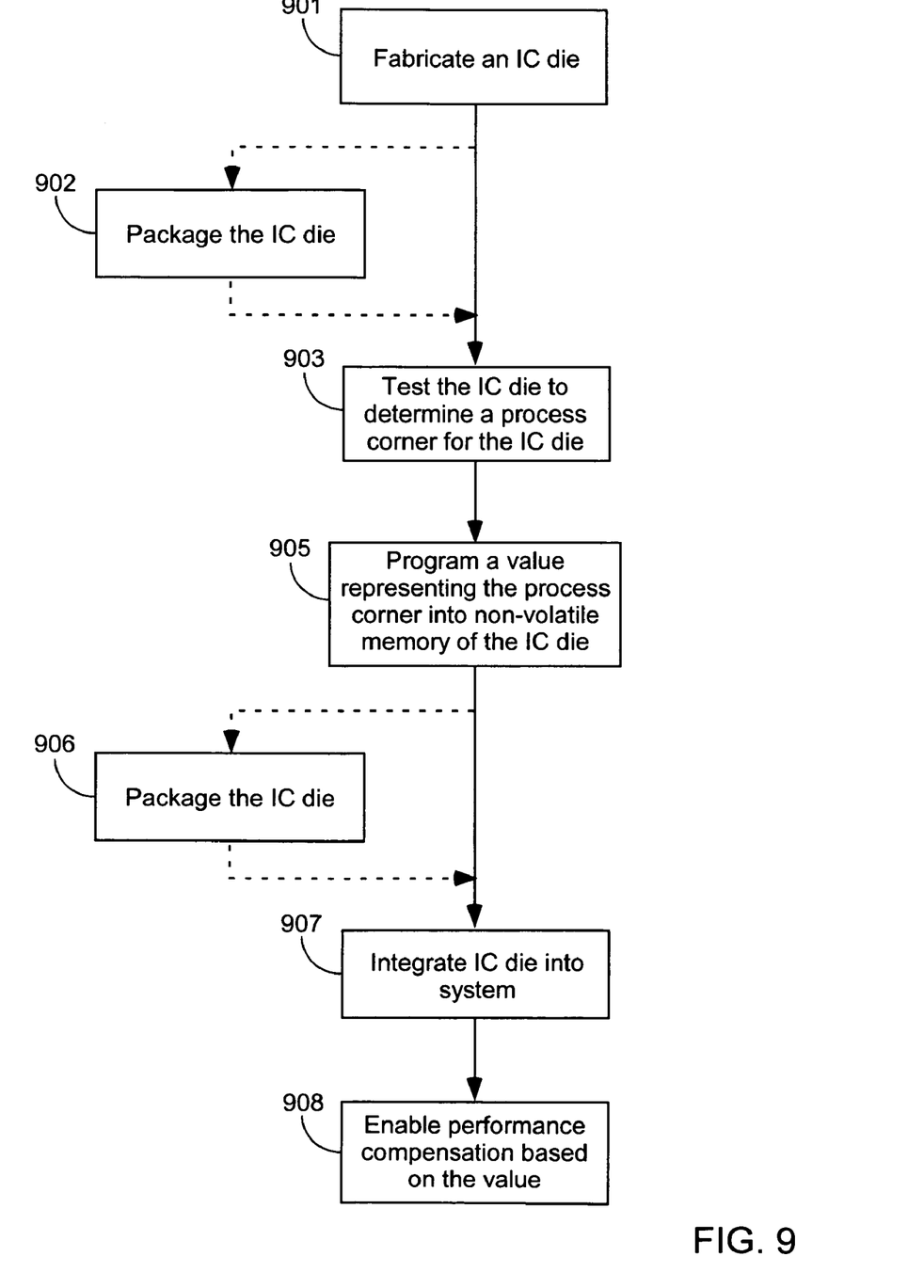
FIG. 9 illustrates the steps of a method of compensating for process variation in an IC die.

FIG. 9 illustrates the steps of a method of compensating for process variation in an IC die. By following the steps of the method shown in FIG. 9, an IC manufacturer, can, for example, test each IC die to determine the process corner of the die, and modify those dice that fall into the slow process corner to balance rising and falling delays in the IC. By balancing rising and falling delays, it may be possible to designate an IC die as a faster speed grade than would be possible without performance compensation. Thus, the method of FIG. 9 can potentially be used to increase the yield of higher speed grade ICs.

Note that the rising and falling delays can be balanced in circuits other than programmable multiplexer circuits. Programmable multiplexer circuits are merely used herein as exemplary applications of the methods shown in FIGS. 9 and 10. Further, the methods of FIGS. 9 and 10 can be applied to ICs other than programmable logic devices (PLDs). For example, the methods of FIGS. 9 and 10 can be applied to non-programmable or partially-programmable ICs.

In step 901, an IC die is fabricated. The IC die can then be packaged (optional step 902), if desired. At step 903, the IC die is tested to determine a process corner for the IC die. Based on the process corner determined in step 903, a value is programmed into non-volatile memory in the IC die, where the value represents the process corner. If the IC die was not previously packaged, the IC die can be packaged in step 906. The IC die is then integrated into a system (e.g., by a customer, step 907), where performance compensation is either enabled or disabled based on the value stored in the non-volatile memory (step 908).

Figure 10:
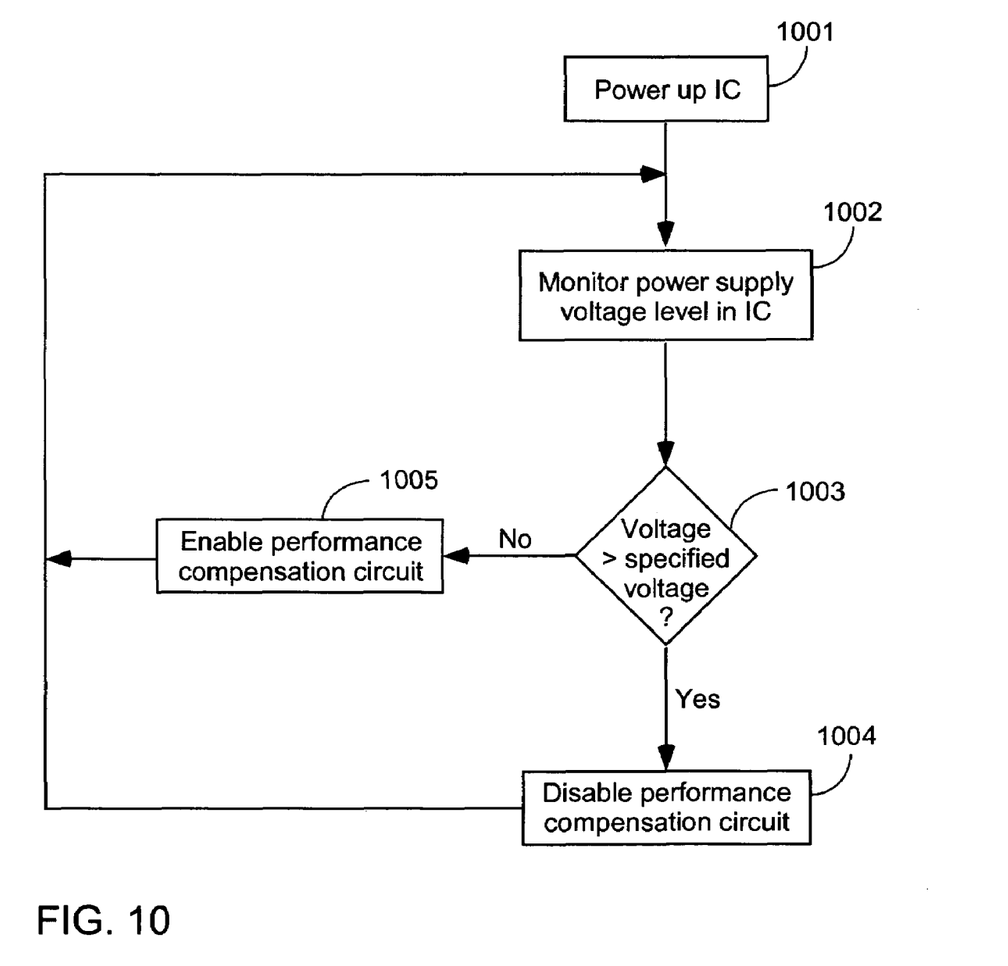
FIG. 10 illustrates the steps of a method of compensating for power supply variation in an IC die.

Performance compensation can also be used to compensate for variations in power supply voltage, as described above in connection with FIGS. 8C and 8D. FIG. 10 illustrates the steps of a method of compensating for power supply variation in an IC die.

In step 1001, an IC is powered up, providing a power supply voltage to the IC. The power supply voltage can be, for example, the gate voltage used to drive the pass transistors in an interconnect structure (e.g., VGG). In other embodiments, the power supply voltage is some other voltage (e.g., VDD). The power supply voltage is monitored at step 1002. In decision step 1003, if the monitored voltage is greater than a specified voltage (greater than or equal to, in some embodiments), a performance compensation circuit in the IC is disabled (step 1004). If the monitored voltage is less than the specified voltage (or less than or equal to, in some embodiments), the performance compensation circuit in the IC is enabled (step 1005). In some embodiments, steps 1002-1005 are continuously performed as long as power is supplied to the IC.

Those having skill in the relevant arts of the invention will now perceive various modifications and additions that can be made as a result of the disclosure herein. For example, the above text describes the circuits and methods of the invention in the context of programmable logic devices (PLDs) such as field programmable logic devices (FPGAs). However, the circuits of the invention can also be implemented in other ICs, including non-programmable ICs and ICs that are only partially programmable.

Further, non-volatile memories, E-fuse structures, E-fuses, pull-ups, pull-downs, transistors, P-channel transistors, N-channel transistors, mid-oxide transistors, low-threshold transistors, logic gates, inverters, multiplexers, multiplexer circuits, input multiplexers, output multiplexers, interconnect multiplexers, routing multiplexer structures, programmable logic elements, configurable logic elements, performance compensation circuits, performance compensation control circuits, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A method of compensating for variations in power supply voltage in an integrated circuit (IC), the method comprising:

monitoring a power supply voltage level in the IC;

enabling, when the power supply voltage level drops below a specified level, a performance compensation circuit in the IC; and disabling the performance compensation circuit when the power supply voltage level exceeds the specified level, wherein the enabling the performance compensation circuit comprises bringing a first one of a rising delay and a falling delay for a compensated circuit in the IC more closely into alignment with a second one of the rising delay and the falling delay for the circuit, wherein the IC comprises a programmable IC, and wherein the compensated circuit comprises a programmable interconnect multiplexer of the programmable IC.

2. The method of claim 1, wherein the monitoring the power supply voltage level in the IC comprises comparing the power supply voltage level to a reference voltage level.

3. The method of claim 1, wherein the monitoring the power supply voltage level in the IC comprises performing an analog-to-digital conversion of the power supply voltage level.

4. The method of claim 1, wherein the monitoring the power supply voltage level comprises monitoring a voltage level applied to pass transistors in the programmable interconnect multiplexer.

5. The method of claim 1, wherein the enabling the performance compensation circuit comprises decreasing a delay of a low-to-high signal transition through the compensated circuit in the IC.

6. The method of claim 5, wherein the monitoring a power supply voltage level in the IC comprises comparing the power supply voltage level to a reference voltage level.

7. The method of claim 5, wherein the monitoring a power supply voltage level in the IC comprises performing an analog-to-digital conversion of the power supply voltage level.

8. The method of claim 1, wherein the monitoring the power supply voltage level comprises monitoring a voltage level applied to pass transistors in the programmable interconnect multiplexer.

9. A method of compensating for variations in power supply voltage in an integrated circuit (IC), the method comprising:
   monitoring a power supply voltage level in the IC;
   enabling, when the power supply voltage level drops below a specified level, a performance compensation circuit in the IC; and
   disabling the performance compensation circuit when the power supply voltage level exceeds the specified level,
   wherein the enabling the performance compensation circuit comprises changing a trip point of a logic gate in a compensated circuit in the IC,
   wherein the IC comprises a programmable IC, and
   wherein the compensated circuit comprises a programmable interconnect multiplexer of the programmable IC.

10. The method of claim 9, wherein the monitoring a power supply voltage level in the IC comprises comparing the power supply voltage level to a reference voltage level.

11. The method of claim 9, wherein the monitoring a power supply voltage level in the IC comprises performing an analog-to-digital conversion of the power supply voltage level.

12. The method of claim 9, wherein the monitoring the power supply voltage level comprises monitoring a voltage level applied to pass transistors in the programmable interconnect multiplexer.

* * * * *